United States Patent
Zhang

(10) Patent No.: US 9,082,615 B2
(45) Date of Patent: Jul. 14, 2015

(54) POLYSILICON MANUFACTURING METHOD THAT CONTROLS GROWTH DIRECTION OF POLYSILICON

(71) Applicant: Shenzhen China Star Optoelectronics Technology Co., Ltd., Shenzhen, Guangdong (CN)

(72) Inventor: Xiang Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/235,764

(22) PCT Filed: Nov. 18, 2013

(86) PCT No.: PCT/CN2013/087362
§ 371 (c)(1),
(2) Date: Jan. 28, 2014

(65) Prior Publication Data
US 2015/0132927 A1    May 14, 2015

(51) Int. Cl.
*H01L 21/36* (2006.01)
*H01L 21/02* (2006.01)

(52) U.S. Cl.
CPC .... *H01L 21/02532* (2013.01); *H01L 21/02595* (2013.01); *H01L 21/02636* (2013.01)

(58) Field of Classification Search
CPC .... H01L 21/02; H01L 27/11517; H01L 29/66
USPC ................................................. 438/487, 157
See application file for complete search history.

(56) References Cited

U.S. PATENT DOCUMENTS

| | | | | |
|---|---|---|---|---|
| 5,268,319 | A | * | 12/1993 | Harari ........................... 438/260 |
| 5,821,135 | A | * | 10/1998 | Mei et al. ........................ 438/57 |
| 7,115,469 | B1 | * | 10/2006 | Halliyal et al. ................. 438/257 |
| 2003/0003242 | A1 | | 1/2003 | Voutsas |

FOREIGN PATENT DOCUMENTS

| | | | |
|---|---|---|---|
| CN | 101005016 | A | 7/2007 |
| CN | 101236898 | A | 8/2008 |
| CN | 102655089 | A | 9/2012 |
| CN | 102709160 | A | 10/2012 |
| CN | 102891107 | A | 1/2013 |

(Continued)

*Primary Examiner* — Caridad Everhart
(74) *Attorney, Agent, or Firm* — Andrew C. Cheng

(57) ABSTRACT

The present invention provides a polysilicon manufacturing method that controls a growth direction of polysilicon, including the following steps: (1) forming a first buffer layer (20) on a substrate (10) through deposition; (2) applying a masking operation to form a lens-like structure (22) on a surface of the first buffer layer (20); (3) depositing and forming an amorphous silicon layer (40) on the first buffer layer (20) of which the surface comprises the lens-like structure (22) formed thereon; (4) subjecting the amorphous silicon layer (40) to rinsing; (5) irradiating the amorphous silicon layer (40) with an intense light (50) from the side of the substrate (10) so as to generate a crystal seed at a bottom of the amorphous silicon layer (40); and (6) applying a laser annealing operation to the amorphous silicon layer (40) that comprises a crystal seed generated therein so as to have amorphous silicon contained in the amorphous silicon layer (40) crystallized and forming a polysilicon layer (70). The present invention enables control of the growth direction of polysilicon.

15 Claims, 6 Drawing Sheets

(56) References Cited

FOREIGN PATENT DOCUMENTS

| | | |
|---|---|---|
| CN | 103219230 A | 7/2013 |
| CN | 103325688 A | 9/2013 |
| JP | 2006093212 A | 4/2006 |
| KR | 20020060919 A | 7/2002 |

* cited by examiner

POLYSILICON MANUFACTURING METHOD THAT CONTROLS GROWTH DIRECTION OF POLYSILICON

BACKGROUND OF THE INVENTION

1. Field of the Invention

The present invention relates to the field of displaying technology, and in particular to a polysilicon manufacturing method that controls the growth direction of polysilicon.

2. The Related Arts

The displaying technology has been under fast development recently. A flat panel display device is significantly different from a traditional video image displaying device by adopting totally different displaying and manufacturing technology. The traditional video image displaying device is generally based on a cathode ray tube (CRT), from which a flat panel display device differs primarily concerning changes made in respect of weight and size (thickness). Generally, a flat panel display device has a thickness not greater than 10 centimeters, among the other differences associated with various technical aspects, such as theory of displaying, manufacturing material, manufacturing process, driving for displaying video images.

The flat panel display device possesses features such as being completely flattened, being light and thin, and energy saving and currently undergoes progresses toward high PPI (pixels per inch), low power consumption, and high integration. Amorphous silicon, which is conventionally used, due to inherent limitation, cannot suit the above described needs and polysilicon is considered the best candidate for substituting amorphous silicon for polysilicon is fit for the needs for future developments of the flat panel display device. Thus, low-temperature polysilicon (LTPS) displaying technology has become a new favorite of the displaying field.

As links of the technical cores of the low temperature polysilicon displaying technology, the manufacturing process and material behavior of polysilicon determine the performance of a display device. The manufacturing processes of polysilicon that are currently known include: low pressure chemical vapor deposition (LPCVD), solid phase crystallization, metal induction, and laser annealing. The most commonly used process in the industry is the laser annealing operation, which uses the high temperature generated by a laser beam to melt amorphous silicon for re-crystallization to form polysilicon. As shown in FIG. 1, a schematic view is given to illustrate the process flow of a conventional way of manufacturing polysilicon, wherein, specifically, a silicon nitride ($SiN_x$) layer 200 is first formed, through deposition, on a glass substrate 100; a silicon oxide ($SiO_x$) layer 300 is then formed, through deposition, on the silicon nitride layer 200; an amorphous silicon (a-Si) layer 400 is then formed, through deposition, on the silicon oxide layer 300; the amorphous silicon layer 400 is subjected to rinsing with hydrogen fluoride (HF); and then the rinsed amorphous silicon layer 400 is irradiated by a laser 500 to carry out a laser annealing operation by which crystallization of the amorphous silicon contained in the amorphous silicon layer 400 is caused to form a polysilicon layer 600. Although such a manufacturing process can better the result of crystallization through adjustment of the parameters of the laser, it is generally not possible to effectively control the growth direction of the polysilicon 600 during the annealing operation so that it is not possible to effectively control where a grain boundary appears.

SUMMARY OF THE INVENTION

An object of the present invention is to provide a polysilicon manufacturing method that controls a growth direction of polysilicon, wherein a light condensation effect realized with a lens-like structure formed on a first buffer layer is used to regularly generate crystal seeds on a bottom of an amorphous layer under irradiation of an intense light so as to control a growth direction of polysilicon in a finally applied laser annealing operation.

To achieve the object, the present invention provides a polysilicon manufacturing method that controls a growth direction of polysilicon, comprising the following steps:

(1) forming a first buffer layer on a substrate through deposition;

(2) applying a masking operation to form a lens-like structure on a surface of the first buffer layer;

(3) depositing and forming an amorphous silicon layer on the first buffer layer of which the surface comprises the lens-like structure formed thereon;

(4) subjecting the amorphous silicon layer to rinsing;

(5) irradiating the amorphous silicon layer with an intense light from the side of the substrate so as to generate a crystal seed at a bottom of the amorphous silicon layer; and (6) applying a laser annealing operation to the amorphous silicon layer that comprises a crystal seed generated therein so as to have amorphous silicon contained in the amorphous silicon layer crystallized and forming a polysilicon layer.

In step (2), an exposure process and a dry etching operation are applied to etch and form the lens-like structure regularly distributed on the surface of the first buffer layer.

Step (3) further comprises depositing and forming a second buffer layer on the first buffer layer, the amorphous silicon layer being formed on the second buffer layer; and in step (4), the rinsing is carried out by spraying hydrogen fluoride to the amorphous silicon layer.

The first buffer layer has a refractive index that is greater than a refractive index of the second buffer layer. The refractive index of the first buffer layer is 1.7-2.1 and the refractive index of the second buffer layer is 1.2-1.7.

The refractive index of the first buffer layer is 1.9 and the refractive index of the second buffer layer is 1.5.

The first buffer layer is formed by deposition of a nitrogen-silicon compound and the second buffer layer is formed by deposition of silicon oxide.

The intense light has a wavelength that is collectively determined by absorption spectrums of the first and second buffer layers, absorption coefficient of the amorphous silicon layer, and focal length of the lens-like structure.

The lens-like structure comprises a projection and the projection has a curved surface contour.

The laser annealing operation uses a laser to irradiate the amorphous silicon layer that comprises the crystal seed generated therein. The laser has a wavelength of 308 nm.

The substrate is a glass substrate or a plastic substrate.

The present invention also provides a polysilicon manufacturing method that controls a growth direction of polysilicon, comprising the following steps:

(1) forming a first buffer layer on a substrate through deposition;

(2) applying a masking operation to form a lens-like structure on a surface of the first buffer layer;

(3) depositing and forming an amorphous silicon layer on the first buffer layer of which the surface comprises the lens-like structure formed thereon;

(4) subjecting the amorphous silicon layer to rinsing;

(5) irradiating the amorphous silicon layer with an intense light from the side of the substrate so as to generate a crystal seed at a bottom of the amorphous silicon layer; and (6) applying a laser annealing operation to the amorphous silicon layer that comprises a crystal seed generated therein so as to have amorphous silicon contained in the amorphous silicon layer crystallized and forming a polysilicon layer;

wherein in step (2), an exposure process and a dry etching operation are applied to etch and form the lens-like structure regularly distributed on the surface of the first buffer layer;

wherein step (3) further comprises depositing and forming a second buffer layer on the first buffer layer, the amorphous silicon layer being formed on the second buffer layer; and in step (4), the rinsing is carried out by spraying hydrogen fluoride to the amorphous silicon layer;

wherein the first buffer layer has a refractive index that is greater than a refractive index of the second buffer layer, the refractive index of the first buffer layer being 1.7-2.1, the refractive index of the second buffer layer being 1.2-1.7;

wherein the refractive index of the first buffer layer is 1.9 and the refractive index of the second buffer layer is 1.5; and wherein the lens-like structure comprises a projection and the projection has a curved surface contour.

The first buffer layer is formed by deposition of a nitrogen-silicon compound and the second buffer layer is formed by deposition of silicon oxide.

The intense light has a wavelength that is collectively determined by absorption spectrums of the first and second buffer layers, absorption coefficient of the amorphous silicon layer, and focal length of the lens-like structure.

The laser annealing operation uses a laser to irradiate the amorphous silicon layer that comprises the crystal seed generated therein. The laser has a wavelength of 308 nm.

The substrate is a glass substrate or a plastic substrate.

The efficacy of the present invention is that the present invention provides a polysilicon manufacturing method that controls a growth direction of polysilicon, wherein an exposure process and a dry etching operation are applied to form a lens-like structure on a surface of a first buffer layer, whereby through light condensation achieved with the lens-like structure, temperature irregularity occurs at a bottom of the amorphous silicon layer under the irradiation of an intense light so as to generate a crystal seed at the bottom of the amorphous silicon layer as desired to thereby enable control of the growth direction of polysilicon in the finally applied laser annealing operation.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
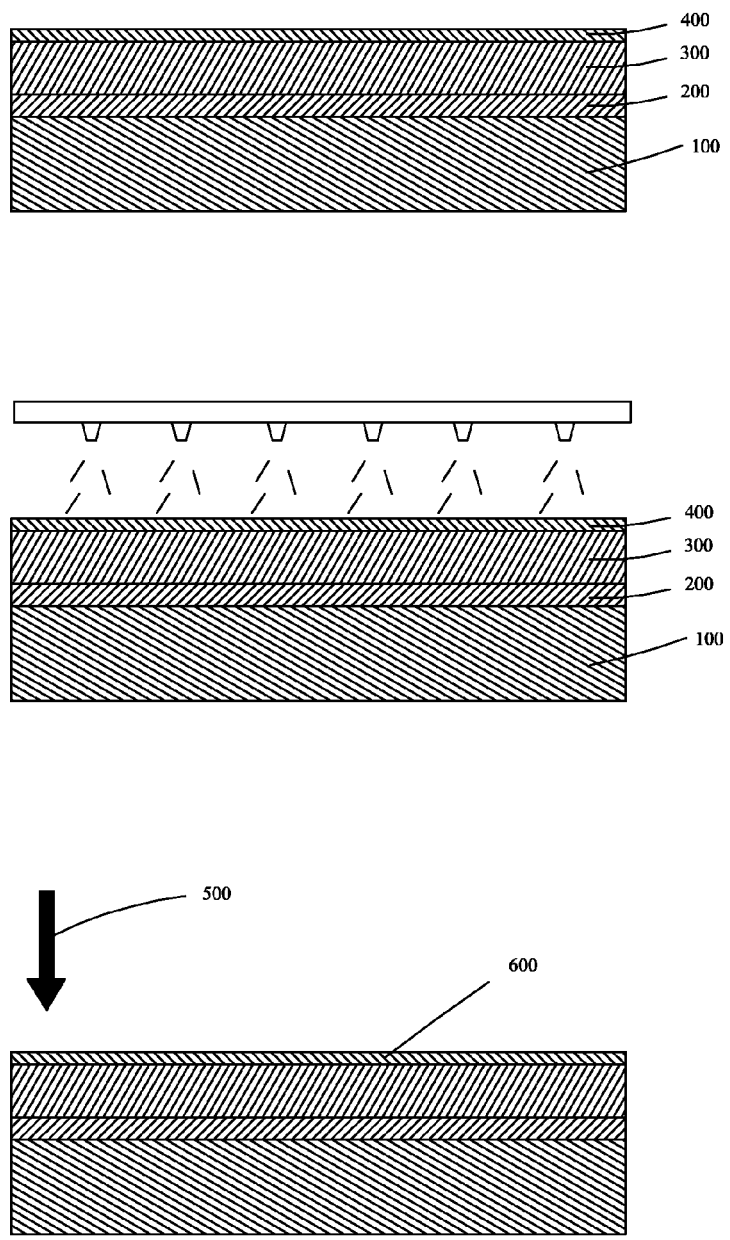
FIG. 1 is a schematic view illustrating a process flow of a conventional way for manufacturing polysilicon.
Figure 2:
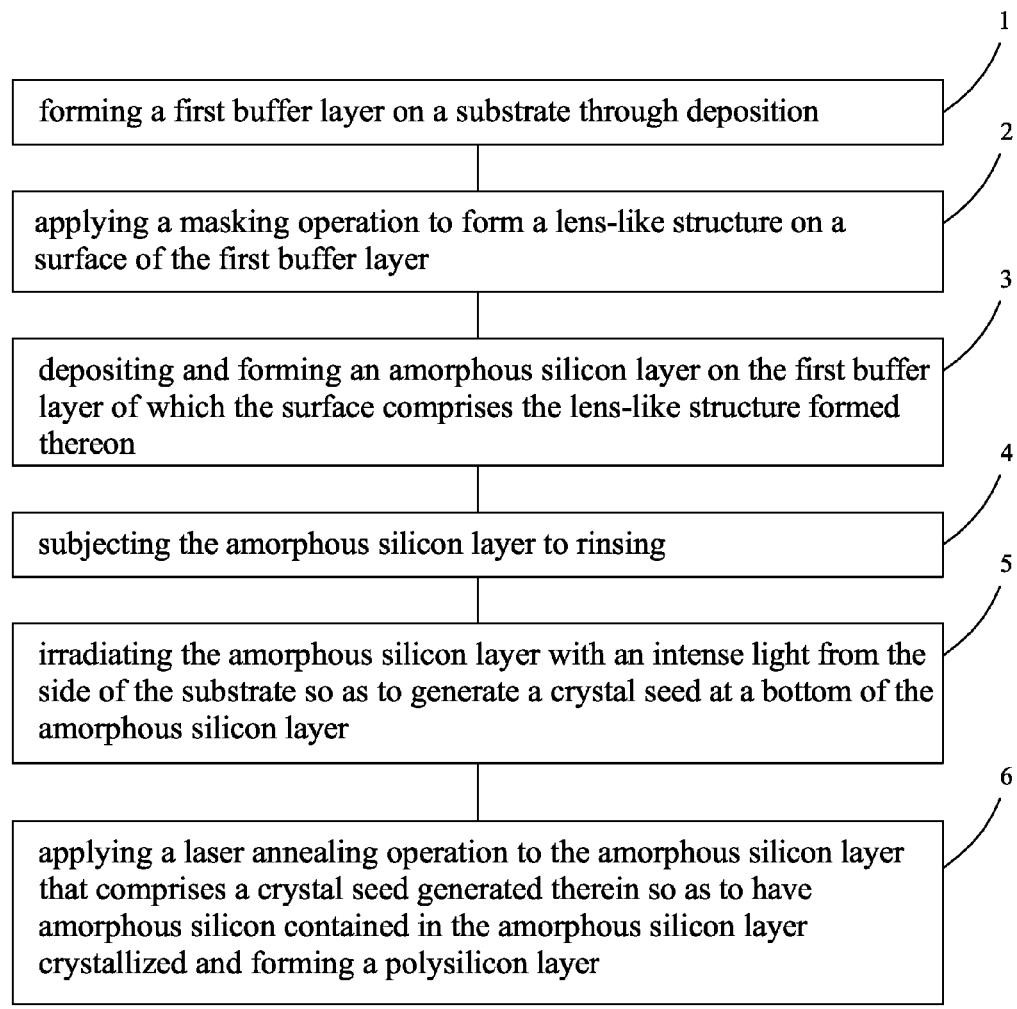
FIG. 2 is a flow chart illustrating a polysilicon manufacturing method that control a growth direction of polysilicon according to the present invention.
Figure 3:
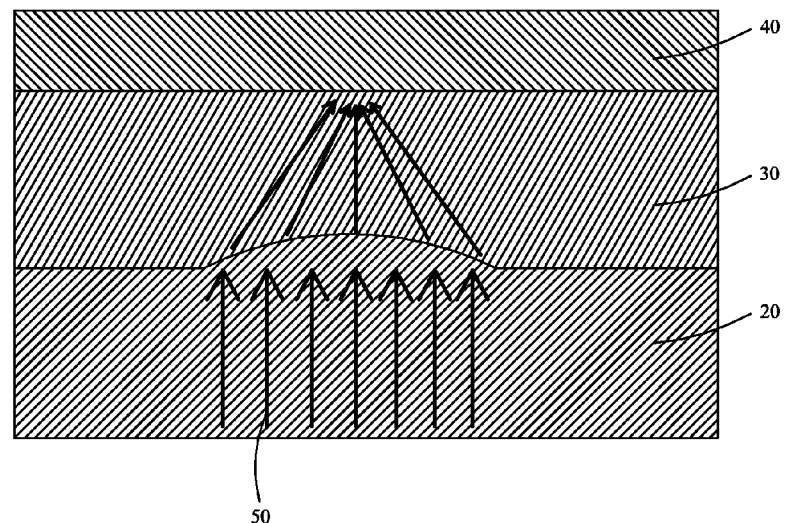
FIG. 3 is a schematic view illustrating applying an intense light to irradiate an amorphous layer according to the present invention.
Figure 4:
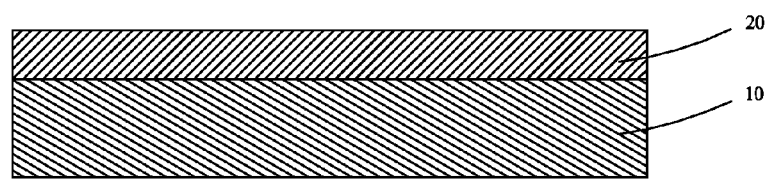
FIG. 4 is a schematic view showing a first buffer layer formed on a substrate according to the present invention.
Figure 5:
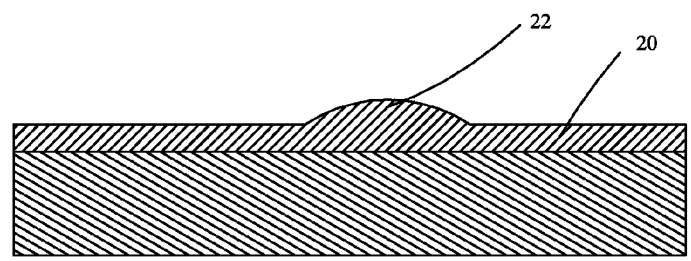
FIG. 5 is a schematic view showing the structure of the first buffer layer according to the present invention after a masking operation.
Figure 6:
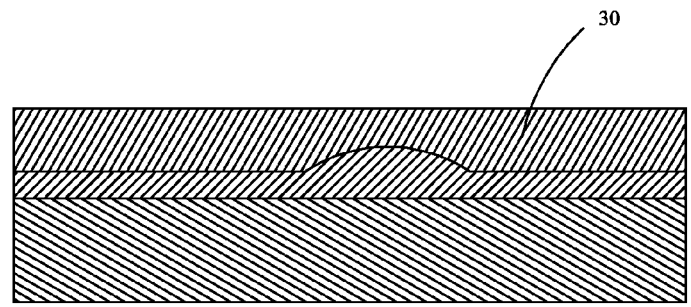
FIG. 6 is a schematic view showing a second buffer layer formed on the first buffer layer according to the present invention.
Figure 7:
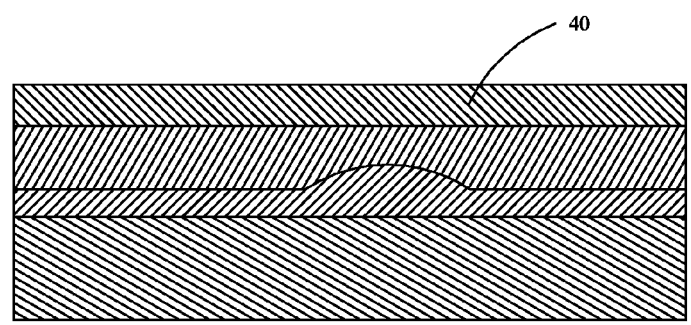
FIG. 7 is a schematic view showing an amorphous silicon layer formed on the second buffer layer according to the present invention.
Figure 8:
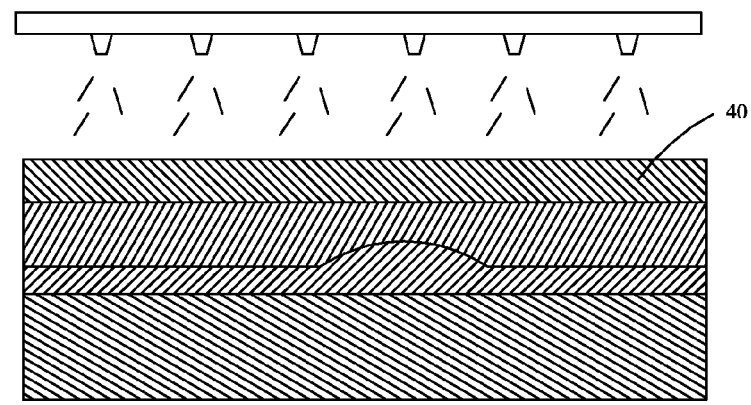
FIG. 8 is a schematic view illustrating rinsing of the amorphous silicon layer according to the present invention.
Figure 9:
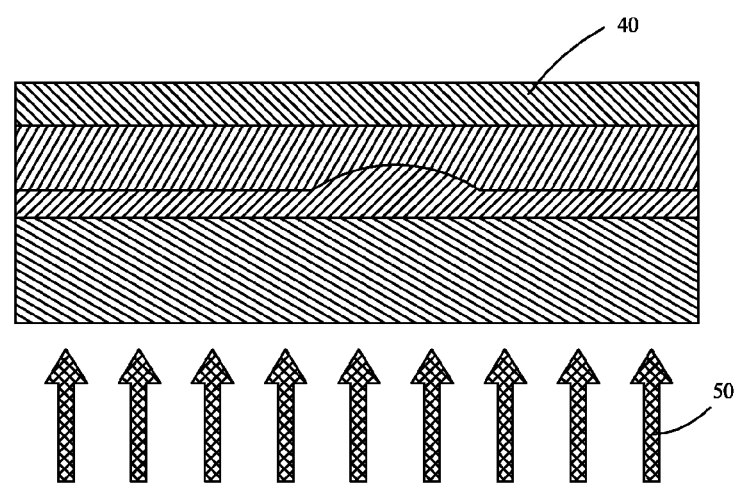
FIG. 9 is a schematic view illustrating irradiating the amorphous silicon with an intense light according to the present invention.
Figure 10:
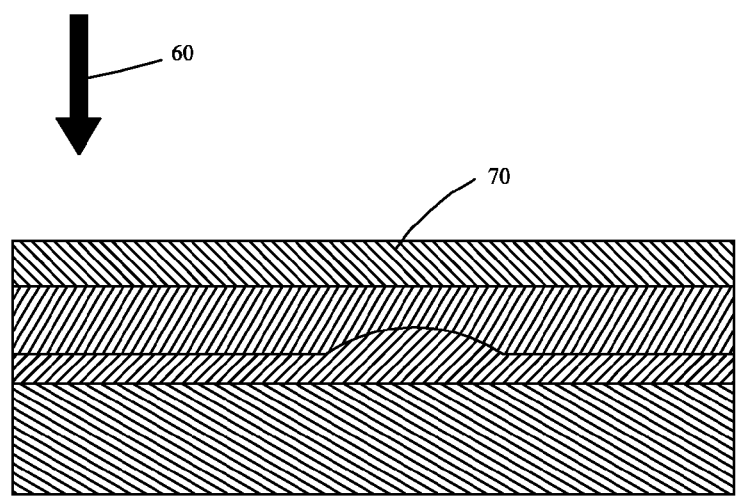
FIG. 10 is a schematic view illustrating a laser annealing operation applied to the amorphous silicon layer according the present invention.

Referring to FIGS. 2-10, the present invention provides a polysilicon manufacturing method that controls a growth direction of polysilicon, comprising the followings steps:

Step 1: forming a first buffer layer 20 on a substrate 10 through deposition.

The first buffer layer 20 has a refractive index of 1.7-2.1. In the instant embodiment, The refractive index of the first buffer layer 20 is preferably 1.9. Further, the first buffer layer 20 is formed by deposition of a nitrogen-silicon compound ($SiN_x$).

The substrate 10 is a glass substrate or a plastic substrate.

Step 2: applying a masking operation to form a lens-like structure 22 on a surface of the first buffer layer 20.

In the step, an exposure process and a dry etching operation are applied as needed (according to a desired growth direction of polysilicon) to etch and form a lens-like structure 22 regularly distributed on the surface of the first buffer layer 20. The lens-like structure 22 comprises a projection and the projection has a curved surface contour for convergence of light.

Step 3: depositing and forming an amorphous silicon layer 40 on the first buffer layer 20 of which the surface comprises the lens-like structure 22 formed thereon.

The step further comprises depositing and forming a second buffer layer 30 on the first buffer layer 20 and the amorphous silicon layer 40 is formed on the second buffer layer 30. The refractive index of the first buffer layer 20 is greater than refractive index of the second buffer layer 30 so as to make light travel light travels from a dense medium to a thin medium to cause refraction of the light and thus facilitate convergence of the light. The refractive index of the second buffer layer 30 is 1.2-1.7. In the instant embodiment, the refractive index of the second buffer layer 30 is preferably 1.5. Further, the second buffer layer 30 is formed by deposition of silicon oxide ($SiO_x$).

Step 4: subjecting the amorphous silicon layer 40 to rinsing through performance of a hydrogen fluoride rinsing operation.

In the step, rinsing is carried out by spraying hydrogen fluoride to the amorphous silicon layer 40 and the specific operation can be carried out according to the known techniques.

Step 5: irradiating the amorphous silicon layer 40 with an intense light 50 from the side of the substrate 10 so as to generate a crystal seed at a bottom of the amorphous silicon layer 40.

The intense light 50 is a parallel light beam generated by an LED (Light-Emitting Diode) light or other lights. The intense light 50 has a wavelength that is determined collectively according to absorption spectrums of the first and second buffer layers 20, 30, the absorption coefficient of the amorphous silicon layer 40, and focal length of the lens-like structure 22. Further, the intense light 50 is irradiated to the amorphous silicon layer 40 after condensation by passing through the lens-like structure 22 of the first buffer layer 20, so as to generate the crystal seed at the bottom of the amorphous silicon layer 40. Specific criteria for selection are that the extinction coefficients of the first and second buffer layers 20, 30 with respect to the intense light 50 are small; the absorption coefficient of the amorphous silicon layer 40 with respect to the intense light 50 is large; and the focal length of the lens-like structure 22 matches thickness of the second buffer layer 30 (so as to ensure that a focusing spot of the intense light 50 is at the bottom of the amorphous silicon layer 40).

Through light condensation by the lens-like structure 22 of the first buffer layer 20, an irregular temperature distribution is realized at the bottom of the amorphous silicon layer 40 so that it is possible to early generate a crystal seed at a desired portion of the bottom of the amorphous silicon layer 40, finally enabling control of a growth direction of a polysilicon grain in a laser annealing operation.

Step 6: applying a laser annealing operation to the amorphous silicon layer 40 that comprises a crystal seed generated therein so as to have amorphous silicon contained in the amorphous silicon layer 40 crystallized and forming a polysilicon layer 70.

The laser annealing operation uses a laser 60 to irradiate the amorphous silicon layer 40 that comprises a crystal seed generated therein to realize the control of the growth direction of the polysilicon gran. The laser 60 has a wavelength that is preferably 308 nm.

In summary, the present invention provides a polysilicon manufacturing method that controls a growth direction of polysilicon, wherein an exposure process and a dry etching operation are applied to form a lens-like structure on a surface of a first buffer layer, whereby through light condensation achieved with the lens-like structure, temperature irregularity occurs at a bottom of the amorphous silicon layer under the irradiation of an intense light so as to generate a crystal seed at the bottom of the amorphous silicon layer as desired to thereby enable control of the growth direction of polysilicon in the finally applied laser annealing operation.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A polysilicon manufacturing method that controls a growth direction of polysilicon, comprising the following steps:
   (1) forming a first buffer layer on a substrate through deposition;
   (2) applying a masking operation to form a lens-like structure on a surface of the first buffer layer;
   (3) depositing and forming an amorphous silicon layer on the first buffer layer of which the surface comprises the lens-like structure formed thereon;
   (4) subjecting the amorphous silicon layer to rinsing;
   (5) irradiating the amorphous silicon layer with an intense light from the side of the substrate so as to generate a crystal seed at a bottom of the amorphous silicon layer; and
   (6) applying a laser annealing operation to the amorphous silicon layer that comprises a crystal seed generated therein so as to have amorphous silicon contained in the amorphous silicon layer crystallized and forming a polysilicon layer.

2. The polysilicon manufacturing method that controls a growth direction of polysilicon as claimed in claim 1, wherein in step (2), an exposure process and a dry etching operation are applied to etch and form the lens-like structure regularly distributed on the surface of the first buffer layer.

3. The polysilicon manufacturing method that controls a growth direction of polysilicon as claimed in claim 1, wherein the lens-like structure comprises a projection and the projection has a curved surface contour.

4. The polysilicon manufacturing method that controls a growth direction of polysilicon as claimed in claim 1, wherein the laser annealing operation uses a laser to irradiate the amorphous silicon layer that comprises the crystal seed generated therein, the laser having a wavelength of 308 nm.

5. The polysilicon manufacturing method that controls a growth direction of polysilicon as claimed in claim 1, wherein the substrate is a glass substrate or a plastic substrate.

6. The polysilicon manufacturing method that controls a growth direction of polysilicon as claimed in claim 1, wherein step (3) further comprises depositing and forming a second buffer layer on the first buffer layer, the amorphous silicon layer being formed on the second buffer layer; and in step (4), the rinsing is carried out by spraying hydrogen fluoride to the amorphous silicon layer.

7. The polysilicon manufacturing method that controls a growth direction of polysilicon as claimed in claim 6, wherein the intense light has a wavelength that is collectively determined by absorption spectrums of the first and second buffer layers, absorption coefficient of the amorphous silicon layer, and focal length of the lens-like structure.

8. The polysilicon manufacturing method that controls a growth direction of polysilicon as claimed in claim 6, wherein the first buffer layer has a refractive index that is greater than a refractive index of the second buffer layer, the refractive index of the first buffer layer being 1.7-2.1, the refractive index of the second buffer layer being 1.2-1.7.

9. The polysilicon manufacturing method that controls a growth direction of polysilicon as claimed in claim 8, wherein the refractive index of the first buffer layer is 1.9 and the refractive index of the second buffer layer is 1.5.

10. The polysilicon manufacturing method that controls a growth direction of polysilicon as claimed in claim 8, wherein the first buffer layer is formed by deposition of a nitrogen-silicon compound and the second buffer layer is formed by deposition of silicon oxide.

11. A polysilicon manufacturing method that controls a growth direction of polysilicon, comprising the following steps:
    (1) forming a first buffer layer on a substrate through deposition;
    (2) applying a masking operation to form a lens-like structure on a surface of the first buffer layer;
    (3) depositing and forming an amorphous silicon layer on the first buffer layer of which the surface comprises the lens-like structure formed thereon;
    (4) subjecting the amorphous silicon layer to rinsing;

(5) irradiating the amorphous silicon layer with an intense light from the side of the substrate so as to generate a crystal seed at a bottom of the amorphous silicon layer; and (6) applying a laser annealing operation to the amorphous silicon layer that comprises a crystal seed generated therein so as to have amorphous silicon contained in the amorphous silicon layer crystallized and forming a polysilicon layer;

wherein in step (2), an exposure process and a dry etching operation are applied to etch and form the lens-like structure regularly distributed on the surface of the first buffer layer;

wherein step (3) further comprises depositing and forming a second buffer layer on the first buffer layer, the amorphous silicon layer being formed on the second buffer layer; and in step (4), the rinsing is carried out by spraying hydrogen fluoride to the amorphous silicon layer;

wherein the first buffer layer has a refractive index that is greater than a refractive index of the second buffer layer, the refractive index of the first buffer layer being 1.7-2.1, the refractive index of the second buffer layer being 1.2-1.7;

wherein the refractive index of the first buffer layer is 1.9 and the refractive index of the second buffer layer is 1.5; and wherein the lens-like structure comprises a projection and the projection has a curved surface contour.

12. The polysilicon manufacturing method that controls a growth direction of polysilicon as claimed in claim 11, wherein the first buffer layer is formed by deposition of a nitrogen-silicon compound and the second buffer layer is formed by deposition of silicon oxide.

13. The polysilicon manufacturing method that controls a growth direction of polysilicon as claimed in claim 11, wherein the intense light has a wavelength that is collectively determined by absorption spectrums of the first and second buffer layers, absorption coefficient of the amorphous silicon layer, and focal length of the lens-like structure.

14. The polysilicon manufacturing method that controls a growth direction of polysilicon as claimed in claim 11, wherein the laser annealing operation uses a laser to irradiate the amorphous silicon layer that comprises the crystal seed generated therein, the laser having a wavelength of 308 nm.

15. The polysilicon manufacturing method that controls a growth direction of polysilicon as claimed in claim 11, wherein the substrate is a glass substrate or a plastic substrate.

* * * * *